(12) United States Patent
Choi et al.

(10) Patent No.: US 7,868,462 B2
(45) Date of Patent: Jan. 11, 2011

(54) SEMICONDUCTOR PACKAGE INCLUDING TRANSFORMER OR ANTENNA

(75) Inventors: Yun-Seok Choi, Hwaseong-si (KR); Hee-Seok Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 358 days.

(21) Appl. No.: 11/541,779

(22) Filed: Oct. 3, 2006

(65) Prior Publication Data

US 2007/0194427 A1    Aug. 23, 2007

(30) Foreign Application Priority Data

Feb. 23, 2006    (KR) ..................... 10-2006-0017903

(51) Int. Cl.
*H01L 23/538* (2006.01)

(52) U.S. Cl. .................. 257/777; 257/686; 257/531; 343/700

(58) Field of Classification Search .............. 257/686, 257/777, E25.006, E25.013, E25.018, E25.021, 257/E25.027, E23.085, E21.614, E23.004, 257/E23.043, E23.05, 0.728, 679, E23.176; 343/895

See application file for complete search history.

(56) References Cited

U.S. PATENT DOCUMENTS

| | | | |
|---|---|---|---|
| 5,023,624 A | 6/1991 | Heckaman et al. | |
| 6,351,033 B1 * | 2/2002 | Lotfi et al. | 257/724 |
| 6,388,636 B1 * | 5/2002 | Brown et al. | 343/866 |
| 6,440,773 B1 * | 8/2002 | Usami | 438/107 |
| 6,686,649 B1 | 2/2004 | Mathews et al. | |
| 7,312,519 B2 * | 12/2007 | Song et al. | 257/686 |
| 2004/0007776 A1 * | 1/2004 | Chen | 257/738 |
| 2004/0061213 A1 | 4/2004 | Karnezos | |
| 2004/0124518 A1 * | 7/2004 | Karnezos | 257/686 |
| 2006/0214271 A1 * | 9/2006 | Loraine et al. | 257/666 |
| 2006/0249828 A1 * | 11/2006 | Hong | 257/686 |

FOREIGN PATENT DOCUMENTS

| | | |
|---|---|---|
| CN | 1243294 A | 2/2000 |
| CN | 1482831 A | 3/2004 |
| CN | 2676405 | 2/2005 |
| JP | 2005-159897 | 6/2005 |
| KR | 1020050090882 | 9/2005 |

* cited by examiner

*Primary Examiner*—Howard Weiss
*Assistant Examiner*—Tifney L Skyles
(74) *Attorney, Agent, or Firm*—Volentine & Whitt, P.L.L.C.

(57) ABSTRACT

A semiconductor package comprises a package board and a plurality of semiconductor chips sequentially stacked on the package board. Each of the semiconductor chips comprises a semiconductor substrate and an open loop-shaped chip line formed on the semiconductor substrate. The open loop-shaped chip line has first and second end portions. The first and second end portions of the open loop-shaped chip lines are electrically connected to each other by connectors, and the connectors and the open loop-shaped chip lines constitute a spiral antenna.

4 Claims, 9 Drawing Sheets

SEMICONDUCTOR PACKAGE INCLUDING TRANSFORMER OR ANTENNA

BACKGROUND OF THE INVENTION

1. Field of the Invention

Embodiments of the invention relate generally to semiconductor packages. More particularly, embodiments of the invention relate to semiconductor packages including a transformer or an antenna.

A claim of priority is made to Korean Patent Application No. 2006-17903, filed Feb. 23, 2006, the disclosure of which is hereby incorporated by reference in its entirety.

2. Description of Related Art

As the size of portable electronic devices continues to shrink, the size of semiconductor packages mounted in the portable electronic devices must be scaled down accordingly. In addition, to increase the computational and/or memory capacity of circuits within the semiconductor packages, packaging techniques have been developed for mounting a plurality of semiconductor chips in a single semiconductor package. These packaging techniques include, for example, a multi chip package (MCP) technique, a multi-stack package (MSP) technique and a system in package (SIP) technique.

Circuits inside some semiconductor packages include an antenna for wireless communication with other circuits such as circuits within adjacent semiconductor packages. The performance of such an antenna tends to vary according to the antenna's length and structure. For example, the performance of an antenna for receiving low frequency signals tends to increase as the length of the antenna increases. That is, increasing the length of the antenna tends to enhance the antenna's low frequency characteristics.

Semiconductor packages are often mounted in integrated circuit (IC) cards. A semiconductor package mounted in an IC card often includes a transformer comprising a solenoid coil for generating internal power based on external power supplied from an external system. In other words, where the IC card contacts a terminal unit of the external system, semiconductor packages in the IC card often generate appropriate internal power through internally mounted transformers.

Semiconductor packages including antennas are disclosed, for example, in U.S. Pat. No. 6,686,649 to Mathews et al., entitled "Multi chip Semiconductor Package with Integral Shield and Antenna," and in U.S. Pat. No. 5,023,624 to Heckaman et al., entitled "Microwave Chip Carrier Package Having Cover-mounted Antenna Element." In these semiconductor packages, a ground shield is formed around a semiconductor chip mounted on a package substrate, and an antenna is formed over the ground shield. The ground shield is designed to prevent electromagnetic interference between signals transmitted or received by the antenna and electrical signals produced by operations of the semiconductor chip. Unfortunately, however, the antenna and the ground shield are generally formed outside semiconductor packages surrounding the semiconductor chips. Hence, these antennas present an obstacle to reducing the overall size of semiconductor packages including the antenna and the ground shield.

SUMMARY OF THE INVENTION

According to one embodiment of the invention, a semiconductor package comprises a package board, and a plurality of semiconductor chips sequentially stacked on the package board. Each of the semiconductor chips comprises a semiconductor substrate and an open loop-shaped chip line formed on the semiconductor substrate, and each of the open loop-shaped chip lines has a first and second end portion. The semiconductor package further comprises connectors electrically connecting the first and second end portions of the open loop-shaped chip lines formed on different semiconductor substrates to form a spiral antenna.

According to another embodiment of the invention, a semiconductor package comprises a package board having a surface and a bulk region, an open loop-shaped board line formed in the bulk region or on the surface of the package board, the open loop-shaped board line having first and second end portions, and a plurality of semiconductor chips sequentially stacked on the package board. Each of the semiconductor chips comprises a semiconductor substrate and an open loop-shaped chip line formed on the semiconductor substrate. Each of the open loop-shaped chip lines has first and second end portions. The semiconductor package further comprises connectors electrically connecting the first and the second end portions of the open loop-shaped chip lines formed on different semiconductor substrates and the first and second portion of the open loop-shaped board line to form a spiral antenna.

According to still another embodiment of the invention, a semiconductor package comprises a package board having a front surface and a back surface, and a plurality of upper semiconductor chips sequentially stacked on the front surface of the package board. Each of the semiconductor chips comprises a semiconductor substrate and an open loop-shaped chip line formed on the semiconductor substrate, and each of the open loop-shaped chip lines has first and second end portions. The semiconductor package further comprises connectors electrically connecting the first and second end portions of the open loop-shaped chip lines formed on different semiconductor substrates to form a spiral antenna, and a lower semiconductor chip mounted on the back surface of the package board.

According to yet another embodiment of the invention, a multi stack package comprises a plurality of sequentially stacked package boards, and a plurality of semiconductor chips respectively mounted on the package boards. Each of the semiconductor chips comprises a semiconductor substrate and an open loop-shaped chip line formed on the semiconductor substrate, and each of the open loop-shaped chip lines has first and second end portions. The semiconductor package further comprises connectors electrically connecting the first and second end portions of the open loop-shaped chip lines formed on different semiconductor substrates to constitute a spiral antenna together with the open loop-shaped chip lines.

According to yet another embodiment of the invention, a semiconductor package comprises a package board, and a plurality of semiconductor chips sequentially stacked on the package board. Each of the semiconductor chips comprises a semiconductor substrate and an open loop-shaped chip line formed on the semiconductor substrate, and each of the open loop-shaped chip lines has first and second end portions. The semiconductor package further comprises a first group of connectors electrically connecting the first end portion of a topmost open loop-shaped chip line among the open loop-shaped chip lines, the second end portion of a lowest open loop-shaped chip line of the open loop-shaped chip lines, and the first and second end portions of intermediate open loop-shaped chip lines between the topmost open loop-shaped chip line and the lowest open loop-shaped chip line, thereby constituting a spiral coil together with the open loop-shaped chip lines. The semiconductor package still further comprises a second group of connectors electrically connected to the second end portion of the topmost open loop-shaped chip line to form an induction coil of a transformer together with the spiral coil.

BRIEF DESCRIPTION OF THE DRAWINGS

The invention is described below in relation to several embodiments illustrated in the accompanying drawings. Throughout the drawings like reference numbers indicate like exemplary elements, components, or steps. In addition, the thickness and scale of some regions, elements, and layers in the drawings may be exaggerated for clarity of illustration. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
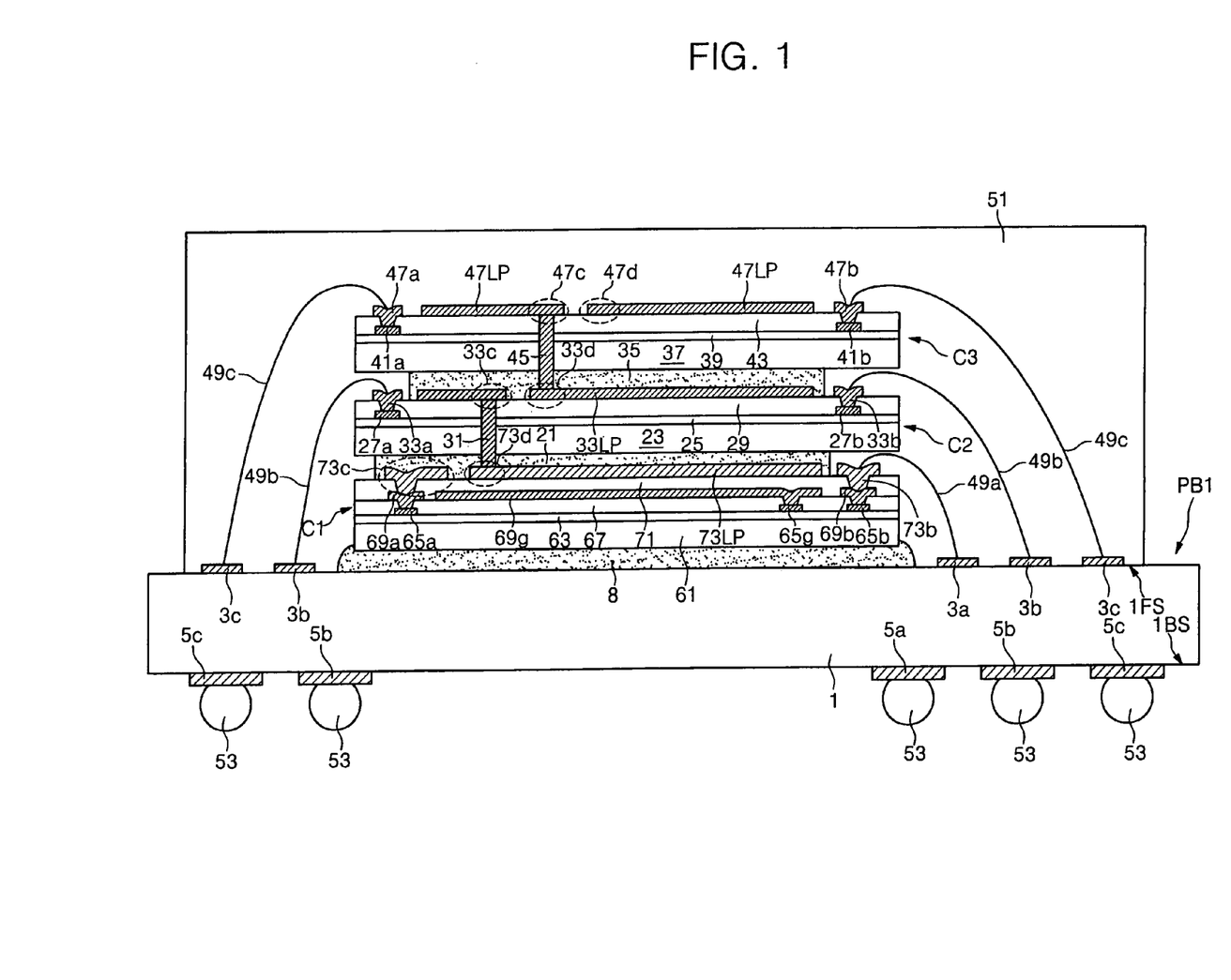
FIG. 1 is a cross-sectional view of a multi chip package according to one embodiment of the invention.
Figure 2:
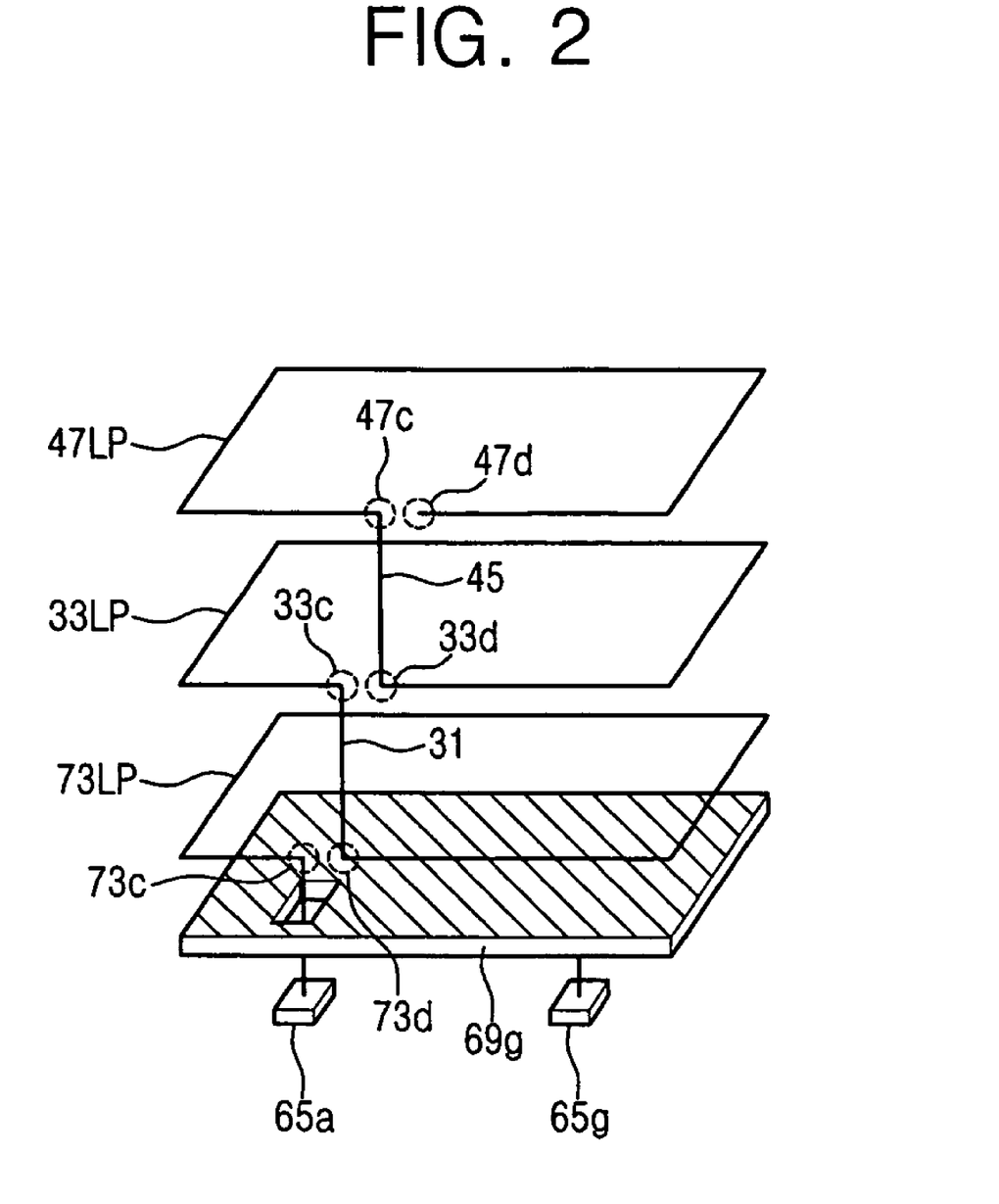
FIG. 2 is a perspective view illustrating a helical antenna and a ground shield in the multi chip package shown in FIG. 1.

FIG. 1 is a cross-sectional view of a multi chip package according to one exemplary embodiment of the present invention and FIG. 2 is a perspective view illustrating a helical antenna and a ground shield of the multi chip package shown in FIG. 1.

Referring to FIGS. 1 and 2, a plurality of semiconductor chips including first through third semiconductor chips C1, C2 and C3, are sequentially stacked on a package board PB1. Package board PB1 comprises a body 1 having a front surface 1FS and a back surface 1BS. Package board PB1 further comprises first through third upper board lines 3a, 3b and 3c formed on front surface 1FS and first through third lower board lines 5a, 5b and 5c formed on back surface 1BS. First through third upper board lines 3a, 3b and 3c are electrically connected to first through third lower board lines 5a, 5b and 5c by first through third board plugs (not shown) passing through body 1, respectively. First through third lower board lines 5a, 5b and 5c are in contact with a plurality of balls 53, respectively.

First through third semiconductor chips C1, C2 and C3 are stacked on front surface 1FS of package board PB1. First semiconductor chip C1 comprises a first semiconductor substrate 61, an interlayer insulating layer 63 formed on the first semiconductor substrate 61, and a plurality of lower chip pads formed on the interlayer insulating layer 63. The lower chip pads comprise first and second lower chip pads 65a and 65b.

In addition, first semiconductor chip C1 comprises a lower insulating layer 67 formed on interlayer insulating layer 63 over first and second lower chip pads 65a and 65b, a plurality of upper chip pads formed on lower insulating layer 67, and an upper insulating layer 71 formed on lower insulating layer 67 over the upper chip pads. The upper chip pads comprise first and second upper chip pads 69a and 69b. First and second upper chip pads 69a and 69b are electrically connected to first and second lower chip pads 65a and 65b through via holes passing through lower insulating layer 67, respectively. Furthermore, first semiconductor chip C1 comprises a first open loop-shaped chip line 73LP formed on upper insulating layer 71. First open loop-shaped chip line 73LP has first and second end portions 73c and 73d. First open loop-shaped chip line 73LP typically comprises a redistributed metal line.

First lower chip pad 65a can be electrically connected to first end portion 73c of first open loop-shaped chip line 73LP in order to act as a transceiving signal pad. In addition, a bonding pad 73b is typically formed on upper insulating layer 71. Bonding pad 73b is electrically connected to second upper chip pad 69b through a via hole passing through upper insulating layer 71.

Where first semiconductor chip C1 is a wire bonding chip, bonding pad 73b is typically electrically connected to first upper board line 3a through a first bonding wire 49a. Where bonding pad 73b is not provided, first bonding wire 49a is typically directly connected to the second upper chip pad 69b. First semiconductor chip C1 typically contacts front surface 1FS of package board PB1 through a first adhesive 8.

Second semiconductor chip C2 contacts first semiconductor chip C1 through a second adhesive 21. Second semiconductor chip C2 comprises a second semiconductor substrate 23, an interlayer insulating layer 25 formed on second semiconductor substrate 23, and first and second chip pads 27a and 27b formed on interlayer insulating layer 25. Second semiconductor chip C2 further comprises an insulating layer 29 formed on interlayer insulating layer 25 over chip pads 27a and 27b and a second open loop-shaped chip line 33LP formed on insulating layer 29.

Second open loop-shaped chip line 33LP has first and second end portions 33c and 33d, and typically comprises a redistributed metal line. Furthermore, second semiconductor chip C2 typically includes first and second bonding pads 33a and 33b formed on insulating layer 29. First and second bonding pads 33a and 33b are electrically connected to respective first and second chip pads 27a and 27b through via holes passing through insulating layer 29.

First end portion 33c of second open loop-shaped chip line 33LP is electrically connected to second end portion 73d of first open loop-shaped chip line 73LP through a first connector 31. First connector 31 typically comprises a first metal plug passing through second semiconductor substrate 23 as shown in FIG. 1.

First and second bonding pads 33a and 33b are electrically connected to second upper board lines 3b through second bonding wires 49b. Where first and second bonding pads 33a and 33b are not provided, second bonding wires 49b are in direct contact with first and second chip pads 27a and 27b.

Third semiconductor chip C3 contacts second semiconductor chip C2 through a third adhesive 35. Third semiconductor chip C3 typically has the same structure as second semiconductor chip C2. For example, in FIG. 1, third semiconductor chip C3 comprises a third semiconductor substrate 37, an interlayer insulating layer 39 formed on third semiconductor substrate 37, and first and second chip pads 41a and 41b formed on interlayer insulating layer 39. In addition, third semiconductor chip C3 comprises an insulating layer 43 formed on interlayer insulating layer 39 over first and second chip pads 41a and 41b, and a third open loop-shaped chip line 47LP formed on insulating layer 43. Third open loop-shaped chip line 47LP has first and second end portions 47c and 47d. Third open loop-shaped chip line 47LP also may be a redistributed metal line. Furthermore, third semiconductor chip C3 includes first and second bonding pads 47a and 47b formed on insulating layer 43. First and second bonding pads 47a and 47b are electrically connected to first and second chip pads 41a and 41b, respectively, through via holes passing through insulating layer 43.

First end portion 47c of third open loop-shaped chip line 47LP is electrically connected to second end portion 33d of second open loop-shaped chip line 33LP through a second connector 45. Second connector 45 comprises a second metal plug passing through third semiconductor substrate 37 as shown in FIG. 1.

First and second bonding pads 47a and 47b are electrically connected to third upper board lines 3c through third bonding wires 49c. Where first and second bonding pads 47a and 47b are not provided, third bonding wires 49c are typically in direct contact with first and second chip pads 41a and 41b. First through third semiconductor chips C1, C2 and C3 and first through third bonding wires 49a, 49b and 49c are encapsulated with an epoxy molding compound 51.

In the device illustrated in FIGS. 1 and 2, first through third open loop-shaped chip lines 73LP, 33LP and 47LP, first connector 31, and second connector 45 constitute a spiral antenna, i.e., a helical antenna, connected to transceiving signal pad 65a.

First semiconductor chip C1 typically comprises a chip having a monolithic microwave integrated circuit (MMIC) formed in first semiconductor substrate 61. Where the MMIC is included in first semiconductor substrate 61, an electromagnetic wave signal generated by the MMIC chip may degrade a transceiving function performed by the antenna. Thus, in order to prevent the performance of the antenna from being degraded due to the electromagnetic wave signal generated by first semiconductor chip C1, first semiconductor chip C1 often further includes a planar type ground shield 69g interposed between first semiconductor substrate 61 and first open loop-shaped chip line 73LP. As an example, planar type ground shield 69g is typically formed between lower insulating layer 67 and upper insulating layer 71. Planar type ground shield 69g corresponds to a ground plate having a large area to overlapping first semiconductor substrate 61, as shown in FIGS. 1 and 2. Ground shield 69g is electrically connected to a ground chip pad 65g formed on interlayer insulating layer 63.

Figure 3:
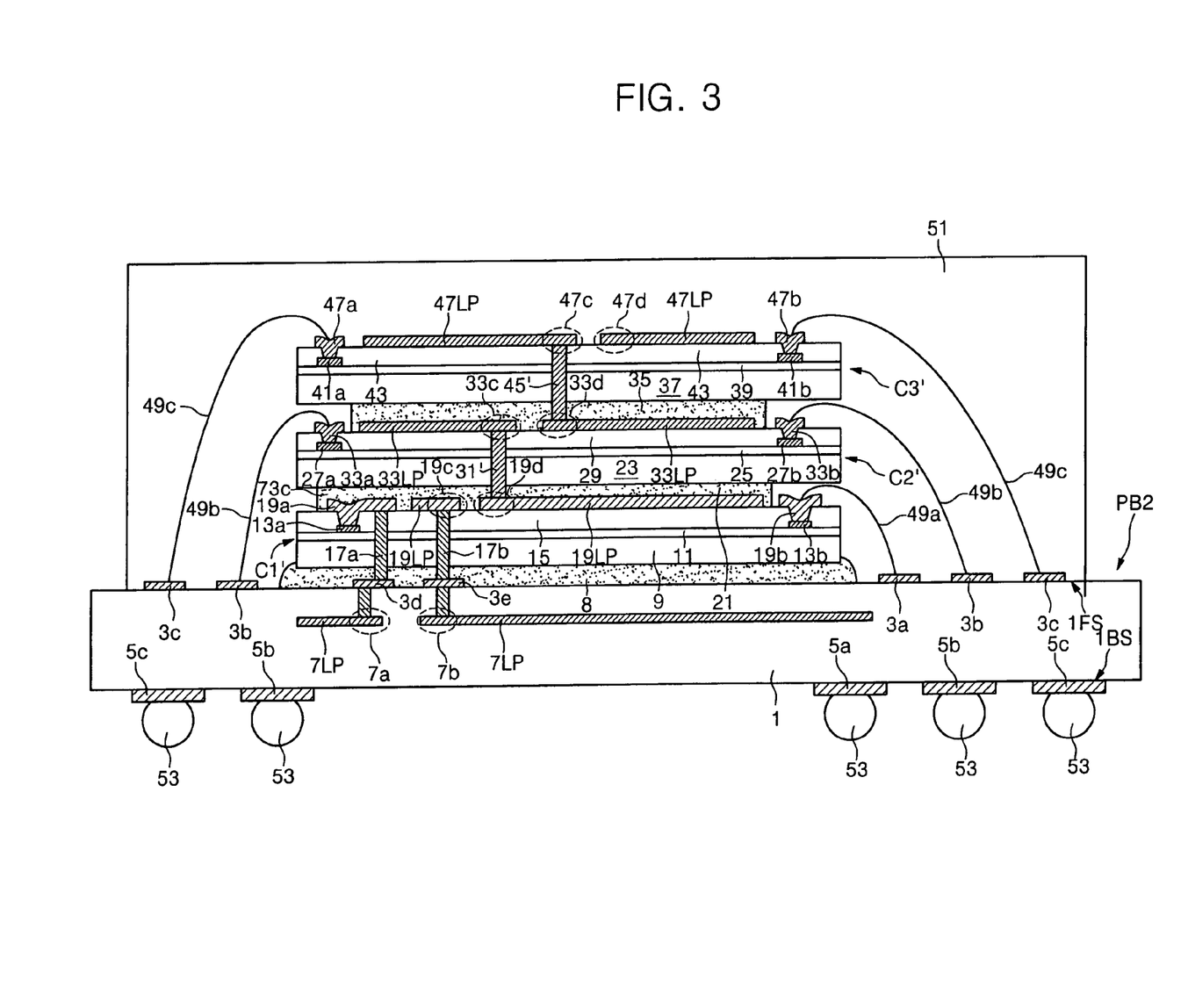
FIG. 3 is a cross-sectional view of a multi chip package according to another embodiment of the invention.
Figure 4:
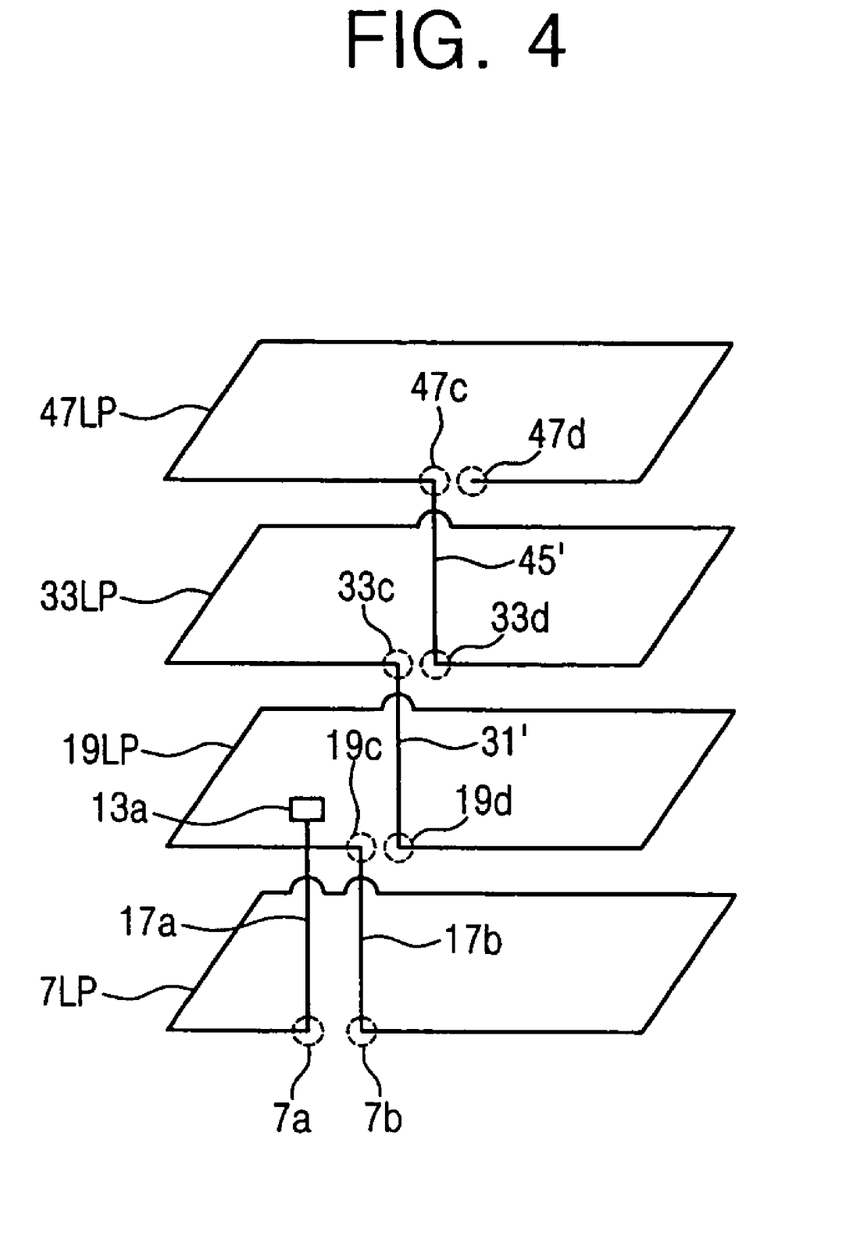
FIG. 4 is a perspective view illustrating a helical antenna in the multi chip package shown in FIG. 3.

FIG. 3 is a cross-sectional view of a multi chip package according to another exemplary embodiment of the present invention, and FIG. 4 is a perspective view illustrating a helical antenna of the multi chip package shown in FIG. 3.

Referring to FIGS. 3 and 4, a plurality of semiconductor chips including first through third semiconductor chip C1', C2' and C3', are sequentially stacked on a package board PB2. Second and third semiconductor chips C2' and C3' have substantially the same components and structure as second and third semiconductor chips C2 and C3 shown in FIG. 1, respectively. Accordingly, detailed descriptions of second and third semiconductor chips C2' and C3' will be omitted to avoid redundancy.

Package board PB2 has a similar structure to package board PB1 shown in FIG. 1. For example, package board PB2 comprises body 1 having front surface 1FS and back surface 1BS, first through third upper board lines 3a, 3b and 3c, first through third lower board lines 5a, 5b and 5c, and balls 53. In addition, package board PB2 further comprises first and second board pads 3d and 3e formed on front surface 1FS and an open loop-shaped board line 7LP formed in body 1. Open loop-shaped board line 7LP also has first and second end portions 7a and 7b.

In other embodiments, open loop-shaped board line 7LP is formed on front surface 1FS or back surface 1BS of body 1. Where open loop-shaped board line 7LP is formed on front surface 1FS of body 1, first and second end portions 7a and 7b of open loop-shaped board line 7LP replace first and second board pads 3d and 3e, respectively.

Alternatively, where open loop-shaped board line 7LP is formed in a bulk region of body 1 or on back surface 1BS of body 1, first and second end portions 7a and 7b of open loop-shaped board line 7LP are electrically connected to first and second board pads 3d and 3e, respectively.

First semiconductor chip C1' is stacked on front surface 1FS of package board PB2. First semiconductor chip C1' comprises a first semiconductor substrate 9, an interlayer insulating layer 11 formed on first semiconductor substrate 9, and a plurality of chip pads formed on interlayer insulating layer 11. The chip pads include first and second chip pads 13a and 13b. In addition, first semiconductor chip C1' includes an insulating layer 15 formed on interlayer insulating layer 11 over first and second chip pads 13a and 13b, and a first open loop-shaped chip line 19LP formed on insulating layer 15. First open loop-shaped chip line 19LP has first and second end portions 19c and 19d and typically comprises a redistributed metal line. First semiconductor chip C1' further comprises a bonding pad 19b formed on insulating layer 15. Bonding pad 19b is electrically connected to second chip pad 13b through a via hole passing through insulating layer 15.

Where first chip pad 13a comprises a transceiving signal pad, first chip pad 13a is electrically connected to first end portion 7a of open loop-shaped board line 7LP through a signal pad connector 17a and a local line 19a, and first end portion 19c of first open loop-shaped chip line 19LP is electrically connected to second end portion 7b of open loop-shaped board line 7LP through a first connector 17b. Local line 19a forms a metal line on insulating layer 15, and signal pad connector 17a and first connector 17b form metal plugs passing through first semiconductor substrate 9.

Where first semiconductor chip C1' is a wire bonding chip, bonding pad 19b is electrically connected to first upper board line 3a through first bonding wire 49a of the exemplary embodiment shown in FIG. 1. Where bonding pad 19b is not provided, first bonding wire 49a is directly connected to second chip pad 13b.

Second semiconductor chip C2' is stacked on first semiconductor chip C1'. Second semiconductor chip C2' has the substantially the same structure as second semiconductor chip C2 of FIG. 1. Thus, first end portion 33c of second open loop-shaped chip line 33LP is electrically connected to second end portion 19d of first open loop-shaped chip line 19LP through a second connector 31'. Second connector 31' typically comprises a metal plug passing though second semiconductor substrate 23 as described above in relation to FIG. 1.

Third semiconductor chip C3' is stacked on second semiconductor chip C2'. Third semiconductor chip C3' has substantially the same structure as third semiconductor chip C3 of FIG. 1. Thus, first end portion 47c of third open loop-shaped chip line 47LP is electrically connected to second end portion 33d of second open loop-shaped chip line 33LP through a third connector 45'. Third connector 45' forms a metal plug passing through third semiconductor substrate 37 as described above in relation to FIG. 1.

As a result, open loop-shaped board line 7LP, first through third open loop-shaped chip lines 19LP, 33LP and 47LP, and connectors 17a, 17b, 31' and 45' constitute a spiral antenna, i.e., a helical antenna, connected to transceiving signal pad 13a, as shown in FIG. 4.

An open loop-shaped board line electrically connected to transceiving signal pad 13a is provided in package board PB2 or on package board PB2. As a result, a length of the antenna of the multi chip package increases relative to the antenna illustrated in FIGS. 1 and 2. Therefore, a low-frequency signal may be transceived through the antenna illustrated in FIGS. 3 and 4.

Figure 5:
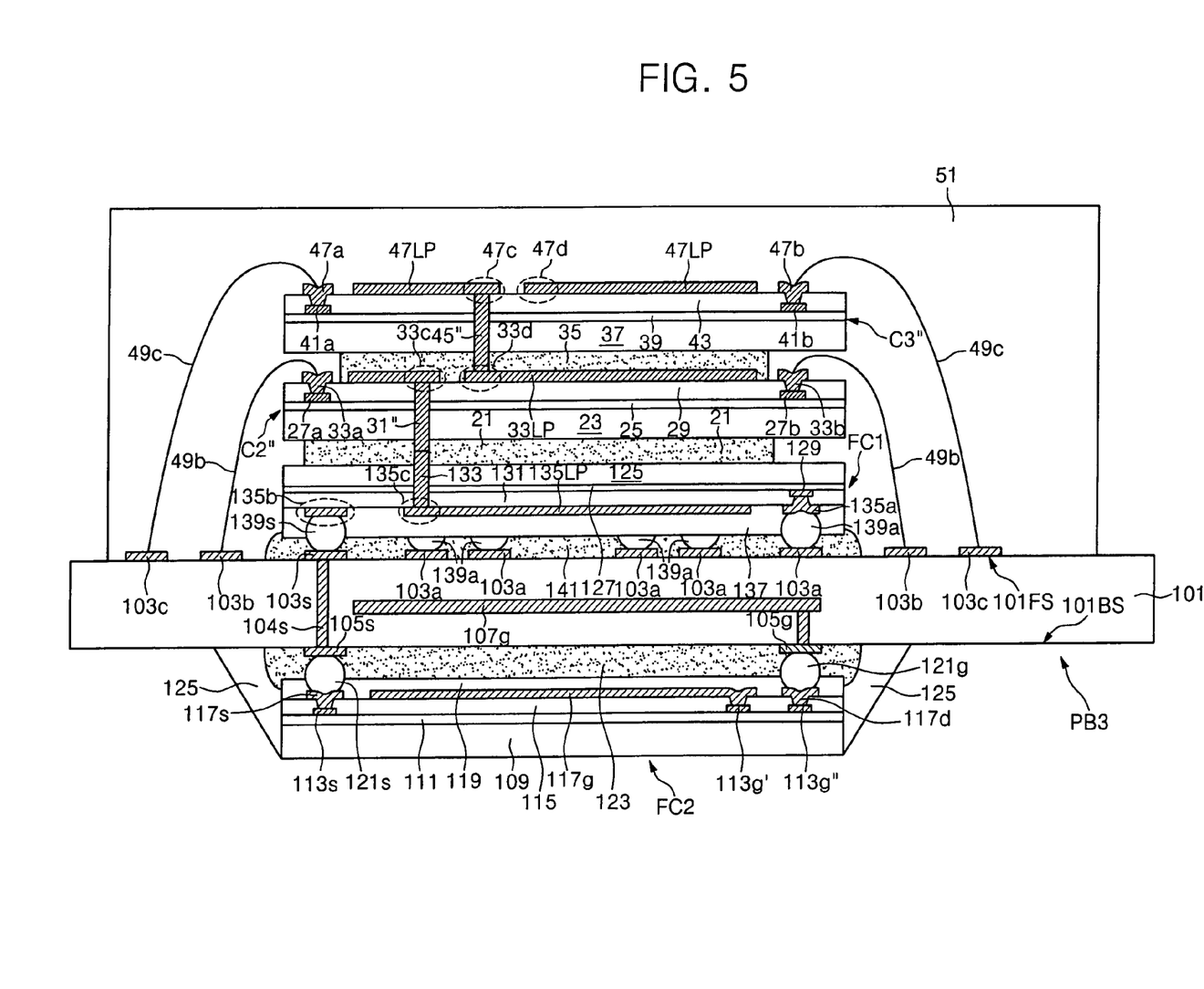
FIG. 5 is a cross-sectional view illustrating a multi chip package according to still another embodiment of the invention.

FIG. 5 is a cross-sectional view of a multi chip package according to still another embodiment of the invention.

Referring to FIG. 5, a plurality of upper semiconductor chips including first through third upper semiconductor chips FC1, C2" and C3" are sequentially stacked on a package board PB3. As shown in FIG. 5, second and third upper chips C2" and C3" have substantially the same structure and components as respective second and third semiconductor chips C2 and C3 illustrated in FIG. 1. Accordingly, a detailed description of second and third upper semiconductor chips C2" and C3" will be omitted from this description to avoid redundancy.

Package board PB3 includes a body 101 having a front surface 101FS and a back surface 101BS. Package board PB3 further comprises first through third upper board lines 103a, 103b and 103c formed on front surface 101FS, and first and second lower board lines 105s and 105g formed on back surface 101BS. Package board PB3 still further comprises an upper transceiving board line 103s formed on front surface 101FS. First lower board line 105s is electrically connected to upper transceiving board line 103s through a board plug 104s passing through body 101. That is, first lower board line 105s corresponds to a lower transceiving board line. Second lower board line 105g corresponds to a ground board line.

A lower semiconductor chip FC2 is formed on back surface 101BS of package board PB3. In the embodiment illustrated in FIG. 5, first upper semiconductor chip FC1 and lower semiconductor chip FC2 comprise respective first and second flip chips. However, one or more of first upper semiconductor chip FC1 and lower semiconductor chip FC2 could alternatively comprise a wire bonding chip having the same configuration as second and third upper semiconductor chips C2" and C3".

First flip chip FC1 comprises a first semiconductor substrate 125, an interlayer insulating layer 127 formed on a front surface of first semiconductor substrate 125, a chip pad 129 formed on interlayer insulating layer 127, a lower insulating layer 131 formed on interlayer insulating layer 127 over chip pad 129, and a first open loop-shaped chip line 135LP formed on lower insulating layer 131. First flip chip FC1 further comprises a bonding pad 135a formed on lower insulating layer 131. Bonding pad 135a is electrically connected to chip pad 129 through a via hole passing through lower insulating layer 131. In addition, first flip chip FC1 comprises an upper insulating layer 137 formed on lower insulating layer 131 over bonding pad 135a and first open loop-shaped chip line 135LP.

First flip chip FC1 further comprises a plurality of metal bumps passing through upper insulating layer 137 and protruding from a surface of upper insulating layer 137. The bumps include a transceiving signal bump 139s and a plurality of chip bumps 139a. Transceiving signal bump 139s is electrically connected to a first end portion 135b of first open loop-shaped chip line 135LP, and chip bumps 139a are electrically connected to power pads, ground pads and signal pads of an inner circuit formed in first semiconductor substrate 125. Transceiving signal bump 139s is in contact with upper transceiving board line 103s, and chip bumps 139a are in contact with corresponding first upper board lines 103a. A first adhesive 141 is formed between first flip chip FC1 and package board PB3.

Second flip chip FC2 comprises a semiconductor substrate 109, an interlayer insulating layer 111 formed on a front surface of semiconductor substrate 109, and chip pads formed on interlayer insulating layer 111. The chip pads include a transceiving signal pad 113s electrically connected to a transceiving terminal of an inner circuit formed in semiconductor substrate 109. The chip pads further include first and second ground pads 113g' and 113g", power pads (not shown), and signal pads (not shown).

Second flip chip FC2 further comprises a lower insulating layer 115 formed on interlayer insulating layer 111 over chip pads 113s, 113g' and 113g", a plurality of bonding pads formed on lower insulating layer 115, an upper insulating layer 119 formed on lower insulating layer 115 over the bonding pads, and a plurality of chip bumps passing through upper insulating layer 119 and contacting the bonding pads. The bonding pads include a transceiving signal bonding pad 117s electrically connected to transceiving signal pad 113s and a ground bonding pad 117d electrically connected to second ground pad 113g", and chip bumps include a transceiving signal bump 121s and ground bump 121g respectively contacting transceiving signal pad 113s and ground bonding pad 117d.

Transceiving signal bump 121s contacts lower transceiving board line 105s, and ground bump 121g contacts ground board line 105g. As a result, transceiving signal pad 113s of second flip chip FC2 is electrically connected to a first end portion 135b of first open loop-shaped chip line 135LP through board plug 104s. An adhesive 123 is formed between second flip chip FC2 and package board PB3. Sidewalls of second flip chip FC2 and adhesive 123 are covered with epoxy resin 125. In this case, a back surface of second flip chip FC2, i.e., a back surface of semiconductor substrate 109, is exposed.

Second and third upper semiconductor chips C2" and C3" are sequentially stacked on a back surface of first flip chip FC1. First end portion 33c of the second open loop-shaped chip line 33LP is electrically connected to second end portion 135c of first open loop-shaped chip line 135LP through first and second connectors 133 and 31". First and second connectors 133 and 31" comprise first and second metal plugs passing through first and second semiconductor substrates 125 and 23, respectively, as shown in FIG. 5. First end portion 47c of third open loop-shaped chip line 47LP is electrically connected to second end portion 33d of second open loop-shaped chip line 33LP through a third connector 45". Third connector 45" forms a third metal plug passing through third semiconductor substrate 37. As a result, first through third open loop-shaped chip lines 135LP, 33LP and 47LP, and first through third connector 133, 31" and 45" constitute a spiral antenna, i.e., a helical antenna, electrically connected to transceiving signal pad 113s of second flip chip FC2.

Where second flip chip FC2 comprises a semiconductor chip having a monolithic microwave integrated circuit (MMIC) formed in semiconductor substrate 109, an electromagnetic wave signal may be generated from the MMIC chip during operation of the MMIC chip. Thus, to prevent the performance of the antenna from being degraded due to the electromagnetic wave signal generated from second flip chip FC2, second flip chip FC2 further includes a planar type ground shield 117g formed on semiconductor substrate 109.

Planar type ground shield 117g may be formed between the lower insulating layer 115 and the upper insulating layer 119. Planar type ground shield 117g may correspond to a ground plate having a large area to overlap semiconductor substrate 109 as shown in FIG. 5. Ground shield 117g is electrically connected to first ground pad 113g'.

In another embodiment, ground shield 117g of second flip chip FC2 is replaced with a planar type ground shield 107g formed in a body 101 or on a surface of package board PB3. Ground shield 107g is electrically connected to second ground pad 113g" of second flip chip FC2 through second lower board line 105g and ground bump 121g.

Figure 6:
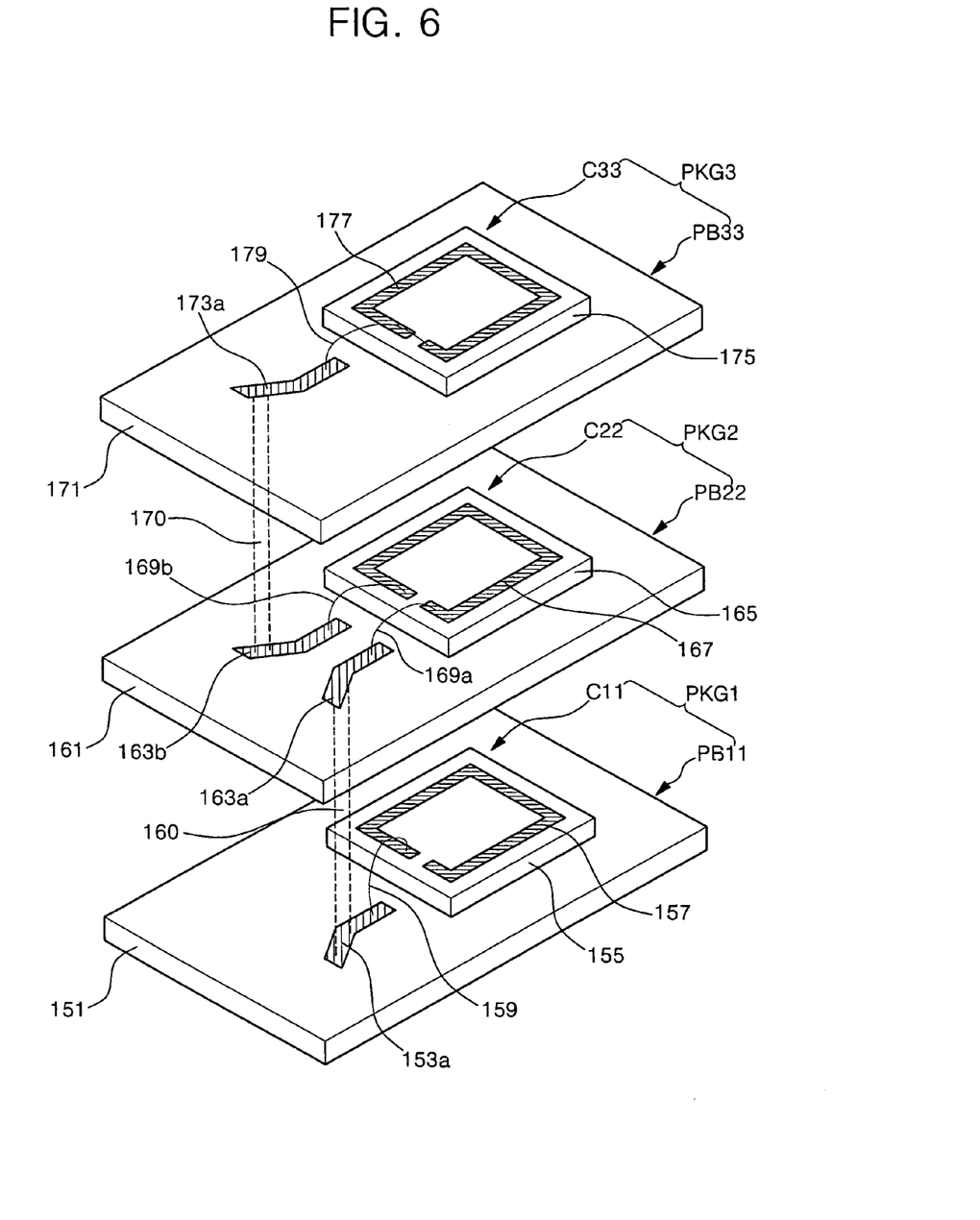
FIG. 6 is an exploded perspective view of a multi stack package according to an embodiment of the invention.

FIG. 6 is an exploded perspective view illustrating a multi stack package according an embodiment of the invention.

Referring to FIG. 6, the multi stack package comprises a plurality of package boards including first through third package boards PB11, PB22 and PB33. First through third package boards PB11, PB22, and PB33 are sequentially stacked. First package board PB11 includes a first body 151 having a front surface and a back surface, and a first board line 153a formed on the front surface of first body 151. Second package board PB22 includes a second body 161 having a front surface and a back surface, and second board lines 163a and 163b formed on the front surface of second body 161. Similarly, third package board PB33 includes a third body 171 having a front surface and a back surface, and a third board line 173a formed on the front surface of third body 171.

A first semiconductor chip C11 is mounted on the front surface of first package board PB11, and a second semiconductor chip C22 is mounted on the front surface of second package board PB22. Similarly, a third semiconductor chip C33 is mounted on the front surface of third package board PB33. As a result, first semiconductor chip C11 is provided between first and second package boards PB11 and PB22, and second semiconductor chip C22 is provided between second and third package boards PB22 and PB33.

First semiconductor chip C11 includes a first semiconductor substrate 155 and a first open loop-shaped chip line 157 formed on first semiconductor substrate 155. Second semiconductor chip C22 includes a second semiconductor substrate 165 and a second open loop-shaped chip line 167 formed on second semiconductor substrate 165. Similarly, third semiconductor chip C33 includes a third semiconductor substrate 175 and a third open loop-shaped chip line 177 formed on third semiconductor substrate 175. First through third open loop-shaped chip lines 157, 167 and 177 typically comprise redistributed metal lines.

First package board PB11 and first semiconductor chip C11 constitute a first semiconductor package PKG1, and second package board PB22 and second semiconductor chip C22 constitute a second semiconductor package PKG2. Also, third package board PB33 and third semiconductor chip C33 constitute a third semiconductor package PKG3. As a result, the semiconductor package is a multi stack package.

A first end portion of first open loop-shaped chip line 157 is electrically connected to a transceiving signal pad (not shown) of an inner circuit formed in first semiconductor substrate 155, and a second end portion of first open loop-shaped chip line 157 is electrically connected to first board line 153a through a first bonding wire 159. A first end portion of the second open loop-shaped chip line 167 is electrically connected to second board line 163a through a second bonding wire 169a, and a second end portion of second open loop-shaped chip line 167 is electrically connected to second board line 163b through a second bonding wire 169b. In addition, a first end portion of third open loop-shaped chip line 177 is electrically connected to third board line 173a through a third bonding wire 179.

First board line 153a is electrically connected to second board line 163a through a first connector 160 such as a solder ball formed on the back surface of second package board PB22, and second board line 163b is electrically connected to third board line 173a through a second connector 170 such as a solder ball formed on the back surface of the third package board PB33. As a result, first through third open loop-shaped chip lines 157, 167 and 177, bonding wires 159, 169a, 169b and 179, board lines 153a, 163a, 163b and 173a, and connectors 160 and 170 constitute a spiral antenna, i.e., a helical antenna.

Where first semiconductor chip C11 is a semiconductor chip having a monolithic microwave integrated circuit (MMIC) formed in first semiconductor substrate 155, an electromagnetic wave signal may be generated from the MMIC chip during operation of the MMIC chip. Thus, to prevent the performance of the antenna from being degraded due to the electromagnetic wave signal generated from first semiconductor chip C11, first semiconductor chip C11 may further include a planar type ground shield (not shown) formed on the first semiconductor substrate 155. The planar type ground shield is typically formed between first open loop-shaped chip line 157 and first semiconductor substrate 155. The ground shield corresponds to a ground plate having a large area to overlap the first semiconductor substrate 155 as described with reference to FIGS. 1, 2 and 5.

Figure 7:
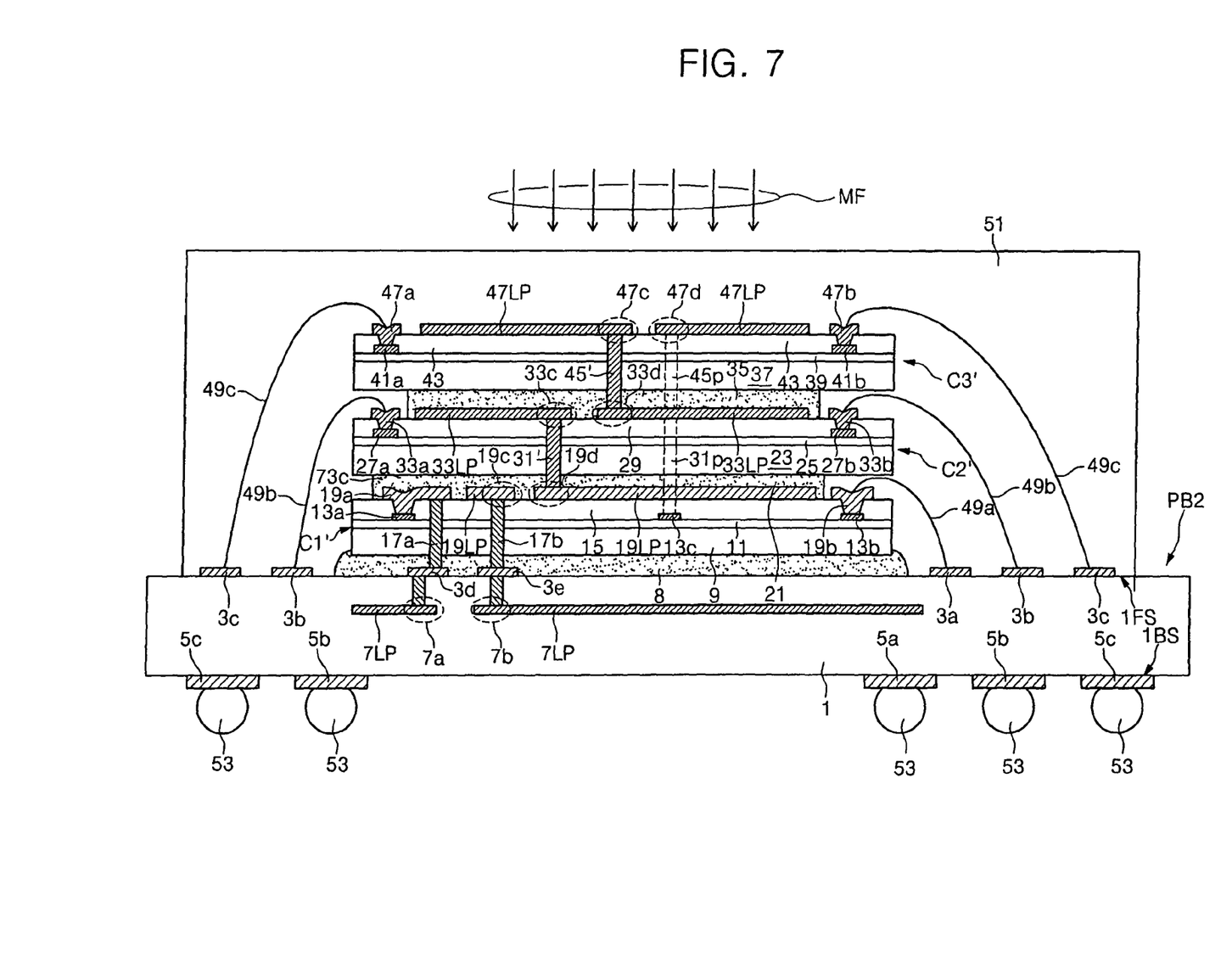
FIG. 7 is a cross-sectional view of a multi chip package according to yet another embodiment of the invention; and, FIGS. 8 to 12 are cross-sectional views illustrating a method of fabricating a semiconductor chip employed in semiconductor packages according to various embodiments of the invention.

FIG. 7 is a cross-sectional view of a multi chip package according to still another embodiment of the invention. This embodiment illustrates a multi chip package having an induction coil of a transformer.

Referring to FIG. 7, the multi chip package is similar to the multi chip package illustrated in FIG. 3, and further comprises connectors 31p and 45p passing through second and third semiconductor substrates 23 and 37 respectively, and a third chip pad 13c formed on first semiconductor substrate 9. Third chip pad 13c is electrically connected to second end portion 47d of third open loop-shaped chip line 47LP through connectors 31p and 45p. As a result, first through third open loop-shaped chip lines 19LP, 33LP and 47LP, open loop-shaped board line 7LP, and connectors 17a, 17b, 31', 45', 31p and 45p constitute an induction coil of a transformer connected to first and third chip pads 13a and 13c. The induction coil corresponds to a solenoid coil.

Where open loop-shaped board line 7LP is not provided, first end portion 19c of first open loop-shaped chip line 19LP is electrically connected to first chip pad 13a. In this case, the induction coil is composed of only first through third open loop-shaped chip lines 19LP, 33LP and 47LP, and connectors 31', 45', 31p and 45p.

The multi chip package illustrated in FIG. 7 is commonly employed in devices such as an integrated circuit card (IC card). Where the multi chip package is used in an IC card, if the IC card contacts a system terminal providing an external magnetic field (MF), the induction coil may generate a power voltage that operates an inner circuit in the IC card. Accordingly, desired communication may be performed between a main system connected to the system terminal and the IC card.

FIGS. 8 through 12 are cross-sectional views illustrating a method of fabricating first semiconductor chip C1' shown in FIG. 3. Although the method is described in relation to first semiconductor chip C1', the method can be readily adapted to forming other semiconductor chips such as second and third semiconductor chips C2' and C3' shown in FIG. 3.

Figure 8:
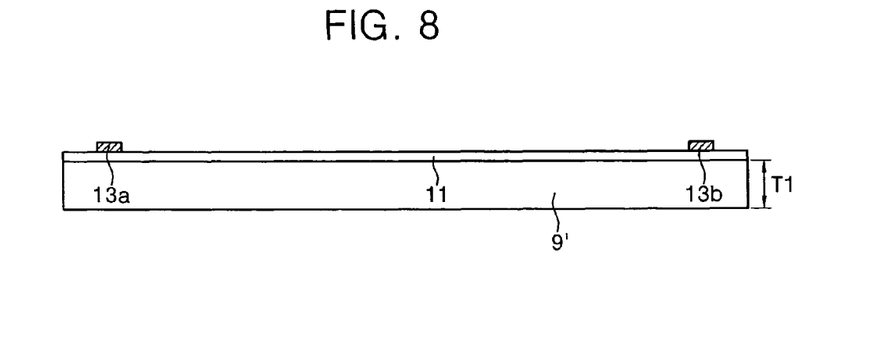

Referring to FIG. 8, interlayer insulating layer 11 is formed on a semiconductor substrate 9' having a first thickness T1. A plurality of chip pads including first and second chip pads 13a and 13b are formed on interlayer insulating layer 11.

Figure 9:
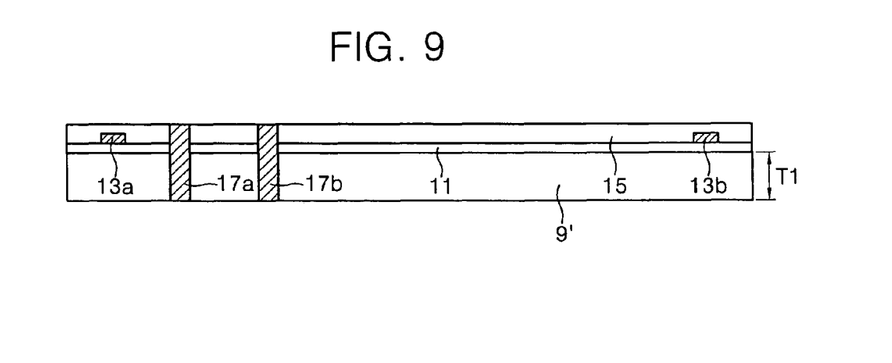

Referring to FIG. 9, lower insulating layer 15 is formed on semiconductor substrate 9' over chip pads 13a and 13b. Lower insulating layer 15, interlayer insulating layer 11 and semiconductor substrate 9' are then patterned to form first and second holes penetrating lower insulating layer 15, interlayer insulating layer 11 and initial semiconductor substrate 9'. The etching process is typically performed using a dry etching process. First and second connectors 17a and 17b are formed in the first and second holes, respectively. Connectors 17a and 17b are typically formed using an electroplating technique so as to constitute metal plugs.

Figure 10:
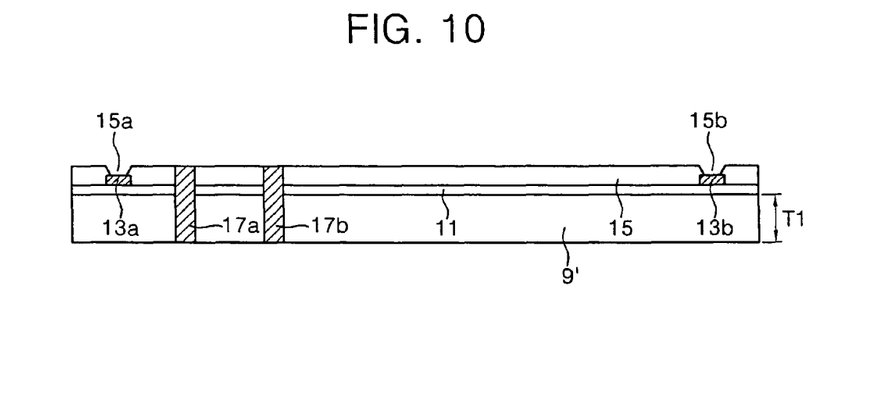

Referring to FIG. 10, lower insulating layer 15 is patterned to form first and second via holes 15a and 15b exposing first and second chip pads 13a and 13b, respectively.

Figure 11:
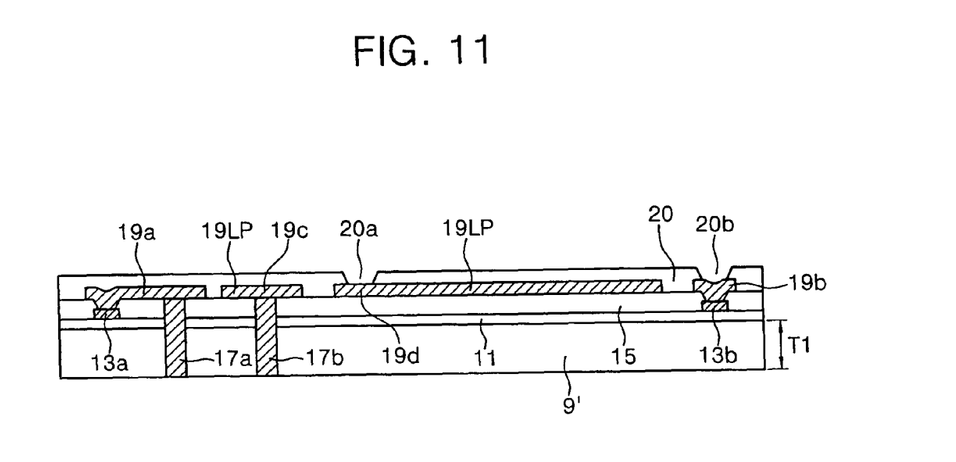

Referring to FIG. 11, a redistributed metal layer is formed on lower insulating layer 15 over first and second via holes 15a and 15b. The redistributed metal layer is then patterned to form an open loop-shaped chip line 19LP, a local line 19a, and a bonding pad 19b. Open loop-shaped chip line 19LP has first and second end portions 19c and 19d.

Open loop-shaped chip line 19LP is formed so that first end portion 19c covers second connector 17b and bonding pad 19b covers second via hole 15b exposing second chip pad 13b. Also, where first chip pad 13a is a transceiving signal pad 13a, local line 19a is formed over first via hole 15a exposing the transceiving signal pad 13a and a top surface of first connector 17a. Under these conditions, first connector 17a forms a signal pad connector. Consequently, first chip pad 13a is electrically connected to first connector 17a through local line 19a.

Next, an upper insulating layer 20 is formed on semiconductor substrate 9' over open loop-shaped chip line 19LP. Upper insulating layer 20 is patterned to form a first opening 20a exposing second end portion 19d of open loop-shaped chip line 19LP and a second opening 20b exposing bonding pad 19b.

Figure 12:
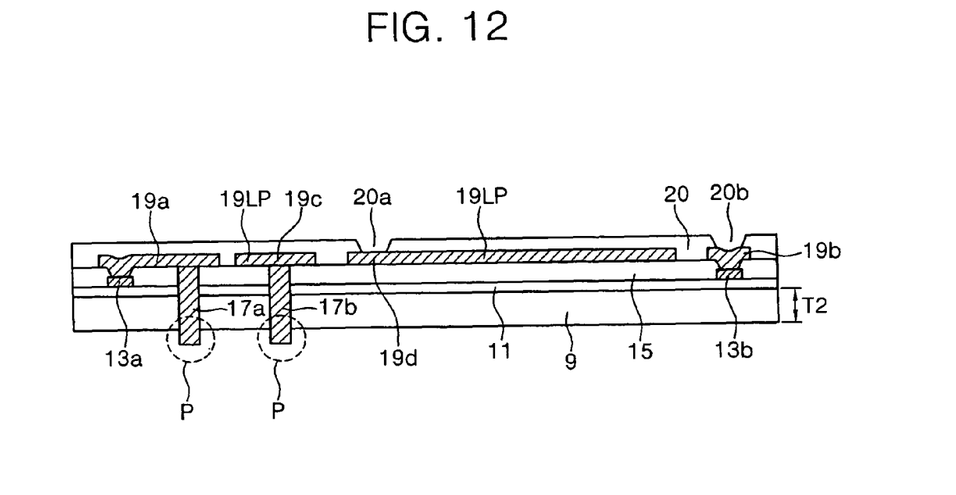

Referring to FIG. 12, a back surface of initial semiconductor substrate 9' is selectively polished to form semiconductor substrate 9 having a second thickness T2 less than first thickness T1. As a result, first and second connectors 17a and 17b protrude from a back surface of semiconductor substrate 9. In other words, first and second connectors 17a and 17b have protrusions "P".

According to the above-described embodiments, open loop-shaped chip lines are formed on semiconductor chips in a semiconductor package, and connectors are also provided to connect end portions of the open loop-shaped chip lines to each other. Accordingly, a spiral antenna connected to a transceiving signal pad of one semiconductor chip among the semiconductor chips is formed using the open loop-shaped chip lines and the connectors. In addition, other connectors electrically connected to an end portion of the spiral antenna may be provided, and the additional connectors may be electrically connected to one chip pad of the semiconductor chips. In this case, an induction coil of a transformer may be realized using the spiral antenna and the additional connectors. As a result, the present invention may provide a high performance antenna and/or a high performance transformer without increase of the semiconductor package size.

The foregoing exemplary embodiments are teaching examples. Those of ordinary skill in the art will understand that various changes in form and details may be made to the exemplary embodiments without departing from the scope of the invention as defined by the following claims.

What is claimed:

1. A semiconductor package comprising:
   a package board;
   a plurality of semiconductor chips sequentially stacked on the package board, each of the semiconductor chips including a semiconductor substrate and an open loop-shaped chip line formed on the semiconductor substrate, and each of the open loop-shaped chip lines having first and second end portions;
   a first group of connectors electrically connecting the first end portion of a topmost open loop-shaped chip line among the open loop-shaped chip lines, the second end portion of a lowest open loop-shaped chip line of the open loop-shaped chip lines, and the first and second end portions of intermediate open loop-shaped chip lines between the topmost open loop-shaped chip line and the lowest open loop-shaped chip line, thereby constituting a spiral coil together with the open loop-shaped chip lines; and,
   a second group of connectors electrically connected to the second end portion of the topmost open loop-shaped chip line to form an induction coil of a transformer together with the spiral coil.

2. The semiconductor package of claim 1, wherein the first and second groups of connectors comprise metal plugs passing through the semiconductor substrates of the semiconductor chips.

3. The semiconductor package of claim 1, wherein the first end portion of the lowest open loop-shaped chip line is electrically connected to a first pad of a lowest chip among the semiconductor chips; and,
   wherein the second end portion of the topmost open loop-shaped chip line is electrically connected to a second pad of the lowest chip through the second group of connectors.

4. The semiconductor package of claim 1, wherein the package board further comprises an open loop-shaped board line provided in a bulk region of the package board or on a surface of the package board to have first and second end portions;
   wherein the first end portion of the open loop-shaped board line is electrically connected to a first pad of a lowest chip among the semiconductor chips;
   wherein the second end portion of the open loop-shaped board line is electrically connected to the first end portion of the lowest open loop-shaped chip line; and,
   wherein the second end portion of the topmost open loop-shaped chip line is electrically connected to a second pad of the lowest chip through the second group of connectors.

* * * * *